(12) United States Patent
Safai

(10) Patent No.: US 10,620,053 B2
(45) Date of Patent: Apr. 14, 2020

(54) THERMAL IMAGING SYSTEM

(71) Applicant: The Boeing Company, Chicago, IL (US)

(72) Inventor: Morteza Safai, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 214 days.

(21) Appl. No.: 15/607,173

(22) Filed: May 26, 2017

(65) Prior Publication Data

US 2018/0340837 A1    Nov. 29, 2018

(51) Int. Cl.
| | | |
|---|---|---|
| *G01J 5/60* | (2006.01) | |
| *B41M 5/46* | (2006.01) | |
| *G01J 5/10* | (2006.01) | |
| *H01L 51/00* | (2006.01) | |
| *G01J 5/08* | (2006.01) | |
| *G01J 5/20* | (2006.01) | |
| *G01J 5/00* | (2006.01) | |
| *G01J 5/12* | (2006.01) | |

(52) U.S. Cl.
CPC .............. *G01J 5/602* (2013.01); *B41M 5/465* (2013.01); *G01J 5/0853* (2013.01); *G01J 5/0881* (2013.01); *G01J 5/10* (2013.01); *G01J 5/20* (2013.01); *H01L 51/0048* (2013.01); *G01J 2005/0077* (2013.01); *G01J 2005/0081* (2013.01); *G01J 2005/106* (2013.01); *G01J 2005/123* (2013.01)

(58) Field of Classification Search
CPC ....... G01J 2005/0051; G01J 2005/0074; G01J 2005/604; G01J 2005/607
See application file for complete search history.

(56) References Cited

U.S. PATENT DOCUMENTS

| | | | |
|---|---|---|---|
| 5,180,921 A | 1/1993 | Moreau et al. | |
| 8,110,883 B2 | 2/2012 | Ward et al. | |
| 9,212,950 B2 | 12/2015 | Xu et al. | |
| 9,250,136 B1* | 2/2016 | Gustavsson | G01J 5/0856 |
| 9,541,453 B2 | 1/2017 | Hu et al. | |
| 9,933,310 B2* | 4/2018 | Fong | G01J 5/0818 |
| 2011/0204461 A1 | 8/2011 | Lee | |
| 2014/0319357 A1 | 10/2014 | Ogawa et al. | |
| 2015/0372159 A1* | 12/2015 | Englund | H01L 31/09 356/328 |
| 2017/0048429 A1* | 2/2017 | Takita | H04N 5/2253 |

FOREIGN PATENT DOCUMENTS

WO      WO9704292 A1      2/1997

OTHER PUBLICATIONS

Blaikie et al, "A fast, sensitive, room-temperature graphene nanomechanical bolometer." arXiv preprint arXiv:1810.13422 (Oct. 2018) (Year: 2018).*

(Continued)

*Primary Examiner* — Clayton E. LaBalle
*Assistant Examiner* — Leon W Rhodes, Jr.
(74) *Attorney, Agent, or Firm* — Yee & Associates, P.C.

(57) ABSTRACT

A thermal imaging system comprises a substrate, stacked graphene arrays on the substrate, and a number of bandpass filters separating the stacked graphene arrays.

20 Claims, 5 Drawing Sheets

(56) References Cited

OTHER PUBLICATIONS

Sun et al, "Graphene and Graphene-like Two-Dimensional Materials in Photodetection: Mechanisms and Methodology." ACS Nano 8, No. 5 (2014): 4133-156. doi:10.1021/nn500508c. (Year: 2014).*
Cassady et al., "High Accuracy Multi-color Pyrometry for High Temperature Surfaces," 28th International Electric Propulsion Conference, Mar. 2003, 9 pages.
Firago et al., "High-temperature three-colour thermal imager," Przegląd Elektrotechniczny, vol. 91, No. 2, Feb. 2015, pp. 208-214.
Rogalski et al., "Terahertz detectors and focal plane arrays," Opto-Electronics Review, vol. 19, No. 3, Sep. 2011, pp. 346-404.
Sahatiya et al., "Graphene-based wearable temperature sensor and infrared photodetector on a flexible polyimide substrate," Flexible and Printed Electronics, vol. 1, No. 2, Jun. 2016, 9 pages.
Extended European Search Report, dated Aug. 2, 2018, regarding Application No. EP18158556.3, 11 pages.
He et al., "Uncooled Carbon Nanotube Photodetectors," Advanced Optical Materials, 2015, pp. 1-23.

* cited by examiner

THERMAL IMAGING SYSTEM

BACKGROUND INFORMATION

1. Field

The present disclosure relates generally to thermal imaging and, in particular, to thermal imaging using carbon nanotubes. More particularly, the present disclosure relates to a method and apparatus for determining an accurate temperature without a known emissivity.

2. Background

Monitoring structure health may include monitoring structure temperatures. High temperature structures, such as aircraft engines may be difficult to monitor.

Conventionally, infrared radiation (IR) detectors are used to determine temperature of a structure. Existing IR detectors do not provide an accurate temperature measurement unless the emissivity of the structure is known. In complex structures or high temperature settings, the emissivity can be affected due to oxidation, reflection, or discoloration. Therefore, an accurate temperature reading is not possible or undesirably difficult using existing IR detectors.

Existing IR detectors, such as InSb and Mercury Cadmium Telluride (MgCdTe) detectors, utilize cooling to minimize the impact of background radiation or noise. Existing IR detectors are cooled either by thermoelectric cooling or liquid nitrogen.

Operation of an existing IR detector in a high temperature application involves encapsulating the IR detector in a cooling device or enclosure. The size of the cooling device and utilities provided to the cooling device may limit the IR detector operation in a difficult-to-access application. Therefore, it would be desirable to have a method and apparatus that take into account at least some of the issues discussed above, as well as other possible issues.

SUMMARY

An illustrative embodiment of the present disclosure provides a method. Graphene is deposited onto a substrate to form a first array of graphene sensors. A first material is placed onto the first array of graphene sensors to form a first bandpass filter. A second layer of graphene is deposited onto the first bandpass filter to form a second array of graphene sensors.

Another illustrative embodiment of the present disclosure provides a method. A thermal imaging system is positioned facing a structure. The thermal imaging system comprises a first array of graphene sensors on a substrate, a second array of graphene sensors stacked on top of the first array of graphene sensors, and a first bandpass filter between the first array of graphene sensors and the second array of graphene sensors. Energy having a first wavelength is received at the first array of graphene sensors. Energy having a second wavelength is received at the second array of graphene sensors, wherein the first wavelength is longer than the second wavelength. A temperature of the structure is determined using a measurement of the energy having the first wavelength and a measurement of the energy having the second wavelength.

A further illustrative embodiment of the present disclosure provides a thermal imaging system. The thermal imaging system comprises a substrate, stacked graphene arrays on the substrate, and a number of bandpass filters separating the stacked graphene arrays.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that graphene changes resistivity as a function of temperature. The illustrative embodiments recognize and take into account that graphene may act as a thermal detector. Graphene may be used to detect infrared energy. The illustrative embodiments recognize and take into account that background noise of resistive detectors may be sufficiently low as to not require cooling. Thus, the illustrative embodiments recognize and take into account that graphene IR detectors have the background noise sufficiently low at ambient temperature to not require cooling.

The illustrative examples recognize and take into account that a temperature may be determined using two or more IR measurements. The illustrative embodiments recognize and take into account that by taking measurements of multiple wavelengths, a temperature may be determined. The illustrative embodiments recognize and take into account that with three wavelengths of radiation, emissivity may be solved for using multi-color pyrometry equations. The illustrative embodiments recognize and take into account that in order to overcome the uncertainty of the emissivity, a multispectral range thermal imaging sensor may desirably measure spectra response of IR from a low to high range. The illustrative embodiments recognize and take into account that one range may be 3-12 microns in wavelength.

The illustrative embodiments recognize and take into account that there are no practical existing solutions for rugged thermal imaging that can withstand a high temperature application and provide multi spectra IR imaging for accurate thermal imaging and temperature measurement. The illustrative embodiments recognize and take into account that imaging array detectors are conventional cooled detectors that measure a narrowband of IR, such as InSb and Mercury Cadmium Telluride (MgCdTe), that have a range of 3-5 and 8-12 microns and require cooling.

The illustrative embodiments recognize and take into account that conventional IR detectors such as MgCdTe detectors are brittle. The illustrative embodiments recognize and take into account that conventional IR detectors for different wavelengths are positioned adjacent to each other. The illustrative embodiments recognize and take into account that stacking conventional IR detectors would result in losing quantum efficiency and accuracy. The illustrative embodiments recognize and take into account that the brittleness of the IR detectors would result in large thermal expansion that could crack the detector. The illustrative embodiments recognize and take into account that stacking conventional IR detectors would not result in accurate temperature measurements.

Figure 1:
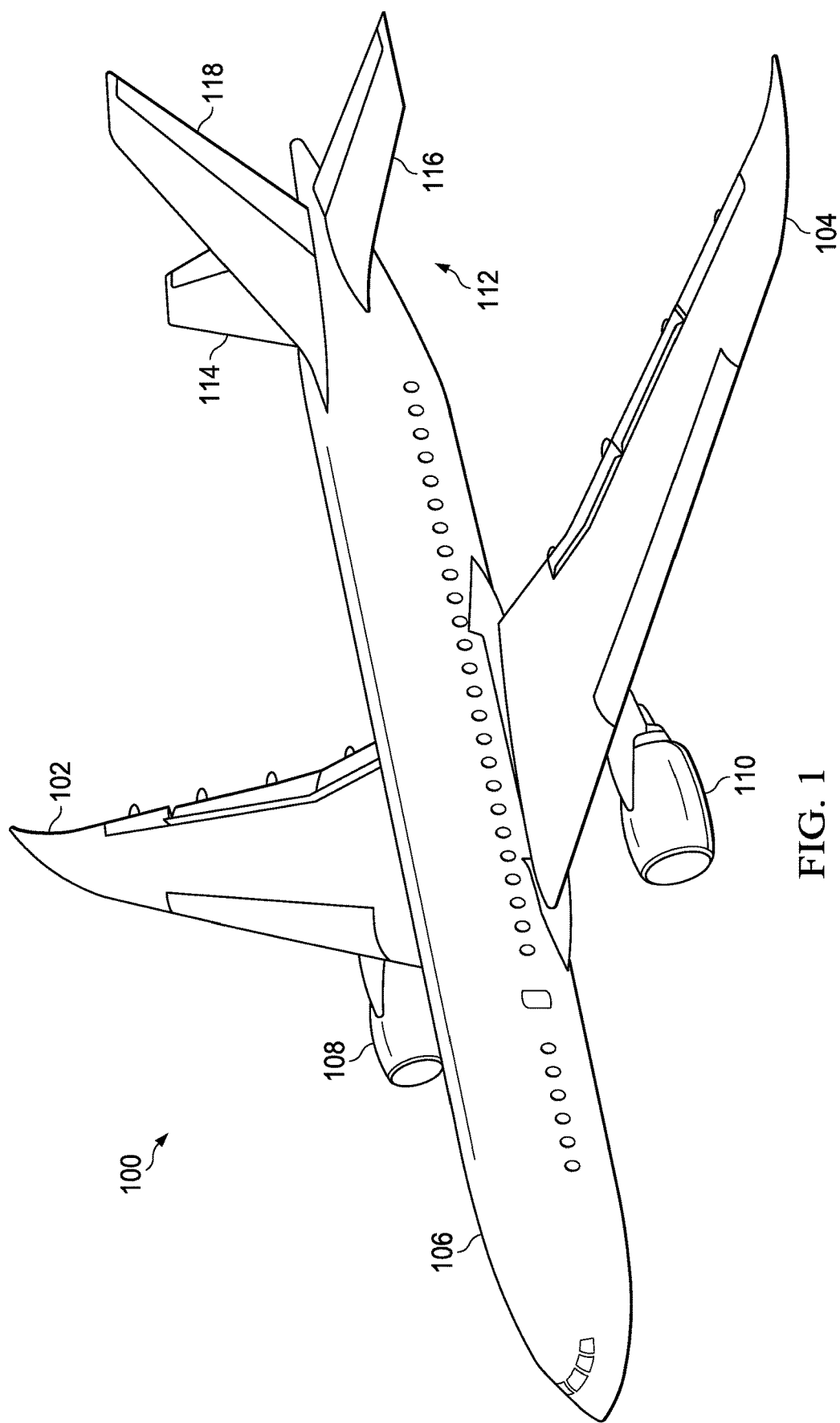
FIG. 1 is an illustration of an aircraft in which an illustrative embodiment may be implemented.

With reference now to the figures and, in particular, with reference to FIG. 1, an illustration of an aircraft is depicted in accordance with an illustrative embodiment. In this illustrative example, aircraft 100 has wing 102 and wing 104 attached to body 106. Aircraft 100 includes engine 108 attached to wing 102 and engine 110 attached to wing 104.

Body 106 has tail section 112. Horizontal stabilizer 114, horizontal stabilizer 116, and vertical stabilizer 118 are attached to tail section 112 of body 106.

Aircraft 100 is an example of an aircraft in which a thermal imaging system may be implemented in accordance with an illustrative embodiment. For example, a thermal imaging system may be affixed within at least one of engine 108 or engine 110.

As used herein, the phrase "at least one of," when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, "at least one of item A, item B, or item C" may include, without limitation, item A, item A and item B, or item B. This example also may include item A, item B, and item C or item B and item C. Of course, any combination of these items may be present. In other examples, "at least one of" may be, for example, without limitation, two of item A, one of item B, and ten of item C; four of item B and seven of item C; or other suitable combinations.

A thermal imaging system within engine 108 may be used to determine the temperature of engine 108 during operation of engine 108. The thermal imaging system within engine 110 may be used to determine the temperature of engine 110 during the operation of engine 110.

Although the illustrative examples for an illustrative embodiment are described with respect to an aircraft, an illustrative embodiment may be applied to other types of platforms. The platform may be, for example, a mobile platform, a stationary platform, a land-based structure, an aquatic-based structure, or a space-based structure. More specifically, the platform may be a surface ship, a tank, a personnel carrier, a train, a spacecraft, a space station, a satellite, a submarine, an automobile, a power plant, a bridge, a dam, a house, a manufacturing facility, a building, or other suitable platforms.

Although the illustrative examples for an illustrative embodiment are described with respect to operation of a platform, an illustrative embodiment may be applied during manufacturing of a platform. For example, an illustrative embodiment may be used during forging of a metal component. In some illustrative examples, an illustrative embodiment may be used during composite curing in autoclave. An illustrative embodiment may be used in any desirable manufacturing process such as metal forging, composite cure, composite layup, in autoclaves, in ovens, during castings, or in conjunction with any other desirable type of manufacturing equipment or process.

Further, an illustrative embodiment may be applied to other desirable process or matter. An illustrative embodiment may be utilized to measure the temperature of pipelines, in astronomical applications, to measure the temperature of explosions, to detect fires, or for any other desirable process or matter.

Figure 2:
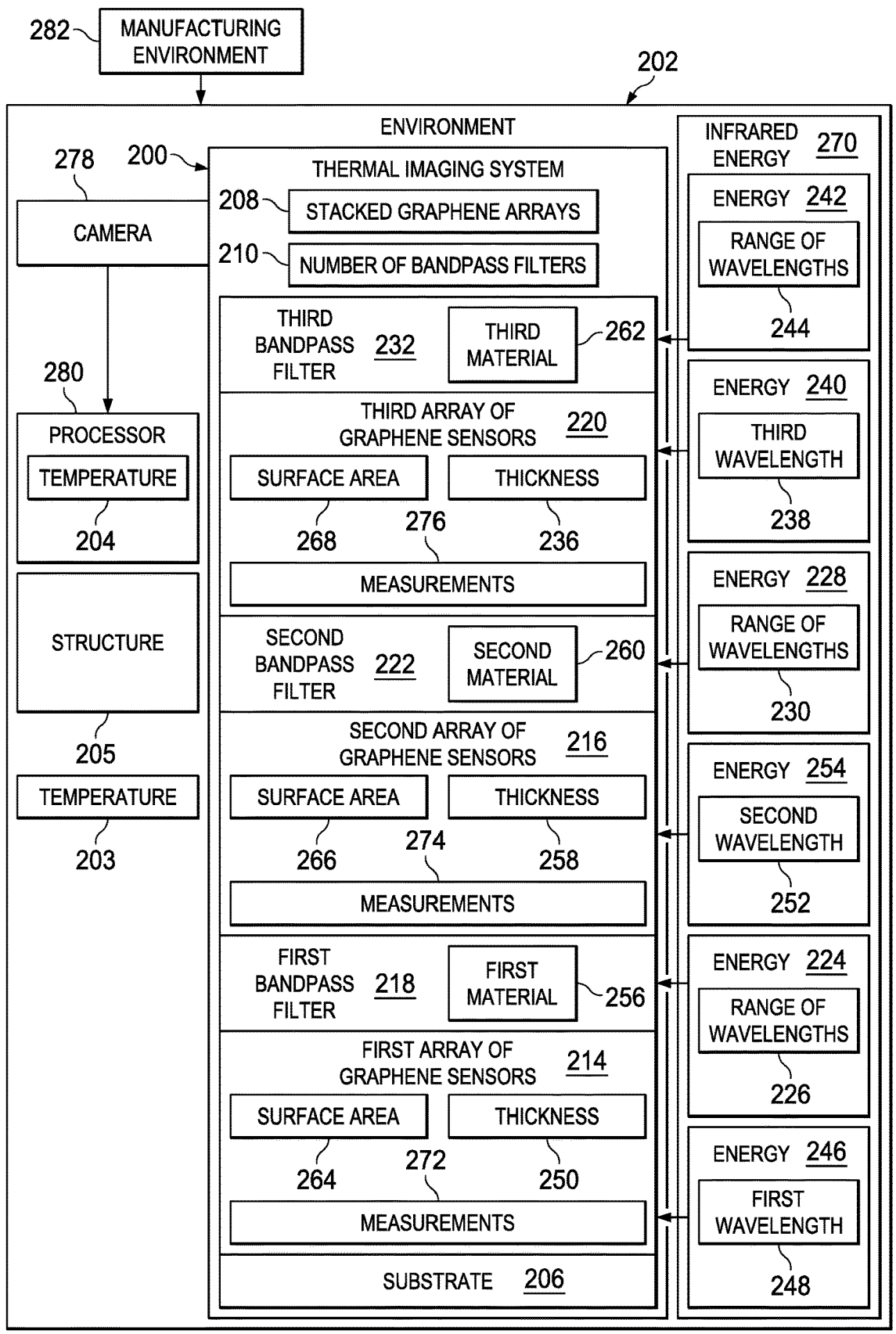
FIG. 2 is an illustration of a block diagram of a thermal imaging system in accordance with an illustrative embodiment.

Turning now to FIG. 2, an illustration of a block diagram of a thermal imaging system is depicted in accordance with an illustrative embodiment. Thermal imaging system 200 may be used to determine temperatures in one of engine 108 or engine 110 of FIG. 1. Environment 202 of FIG. 2 may be a depiction of a volume surrounding a portion of aircraft 100 of FIG. 1, such as engine 108 or engine 110. Environment 202 has its own temperature, temperature 203. In some illustrative examples, temperature 203 is an ambient temperature.

As depicted, thermal imaging system 200 is used to determine temperature 204 of structure 205. Thermal imaging system 200 is faced towards structure 205 to receive infrared energy 270 from structure 205. Infrared energy 270 received by thermal imaging system 200 is used to determine temperature 204 of structure 205.

In some illustrative examples, structure 205 may be within environment 202. Temperature 203 of environment 202 may be considered a surrounding temperature for purposes of determining temperature 204 of structure 205.

Thermal imaging system 200 comprises substrate 206, stacked graphene arrays 208 on substrate 206, and number of bandpass filters 210 separating stacked graphene arrays 208. In some illustrative examples, each of number of bandpass filters 210 is configured to absorb infrared energy. When thermal imaging system 200 faces structure 205, stacked graphene arrays 208 are between substrate 206 and structure 205.

Stacked graphene arrays 208 comprise a plurality of two-dimensional sensor arrays. Each bandpass filter of number of bandpass filters 210 is sandwiched between two respective graphene arrays of stacked graphene arrays 208.

Stacked graphene arrays 208 include any desirable quantity of graphene arrays. In one illustrative example, stacked graphene arrays 208 have only two graphene arrays. In another illustrative example, stacked graphene arrays 208 have three graphene arrays. In some illustrative examples, stacked graphene arrays 208 may have more than three graphene arrays.

As depicted, stacked graphene arrays 208 comprises first array of graphene sensors 214 on substrate 206 and second array of graphene sensors 216 stacked on top of first array of graphene sensors 214. When stacked graphene arrays 208 has first array of graphene sensors 214 and second array of graphene sensors 216, number of bandpass filters 210 comprises first bandpass filter 218 between first array of graphene sensors 214 and second array of graphene sensors 216.

As depicted, stacked graphene arrays 208 further comprise third array of graphene sensors 220 stacked on top of second array of graphene sensors 216. When third array of graphene sensors 220 is present, number of bandpass filters 210 further comprises second bandpass filter 222 between second array of graphene sensors 216 and third array of graphene sensors 220.

First bandpass filter 218 absorbs a range of longer wavelengths of energy than second bandpass filter 222. First bandpass filter 218 absorbs energy 224 having range of wavelengths 226. Second bandpass filter 222 absorbs energy 228 having range of wavelengths 230. Wavelengths in range of wavelengths 226 are longer than wavelengths in range of wavelengths 230.

In some illustrative examples, third bandpass filter 232 is on top of third array of graphene sensors 220. Third bandpass filter 232 is optional when third array of graphene sensors 220 is present. In some illustrative examples, thickness 236 of third array of graphene sensors 220 determines third wavelength 238 of energy 240 detected by third array of graphene sensors 220 without third bandpass filter 232. When present, third bandpass filter 232 reduces the amount of energy encountering third array of graphene sensors 220. Third bandpass filter 232 reduces the quantity of wavelengths encountering third array of graphene sensors 220.

Second bandpass filter 222 absorbs a range of longer wavelengths of energy than third bandpass filter 232. Second bandpass filter 222 absorbs energy 228 having range of wavelengths 230. Third bandpass filter 232 absorbs energy 242 having range of wavelengths 244. Wavelengths in range of wavelengths 230 are longer than wavelengths in range of wavelengths 244.

In thermal imaging system 200, each of stacked graphene arrays 208 on substrate 206 has a thickness of about 10-50 microns. Energy 246 having first wavelength 248 received by first array of graphene sensors 214 is affected by first bandpass filter 218 and thickness 250 of first array of graphene sensors 214. First bandpass filter 218 absorbs range of wavelengths between second wavelength 252 of energy 254 and first wavelength 248 of energy 246.

First material 256 is selected to absorb range of wavelengths 226. First material 256 may be selected such that range of wavelengths 226 provides a desirable difference between second wavelength 252 of energy 254 and first wavelength 248 of energy 246.

Thickness 250 of first array of graphene sensors 214 affects first wavelength 248. Thickness 250 is selected to only detect first wavelength 248 due to penetration of energy 246. Each of stacked graphene arrays 208 on substrate 206 has a thickness of about 10-50 microns. Thickness 250 is in the range of about 10 microns to about 50 microns.

When stacked graphene arrays 208 includes only first array of graphene sensors 214 and second array of graphene sensors 216, second bandpass filter 222 is optional. Energy 254 having second wavelength 252 received by second array of graphene sensors 216 is affected by second bandpass filter 222, when present, and thickness 258 of second array of graphene sensors 216.

Third array of graphene sensors 220 may be optional. When third array of graphene sensors 220 is present, second bandpass filter 222 is also present. When third array of graphene sensors 220 and second bandpass filter 222 are present, second bandpass filter 222 absorbs range of wavelengths 230 between second wavelength 252 of energy 254 and third wavelength 238 of energy 240.

Second material 260 is selected to absorb range of wavelengths 230. Second material 260 may be selected such that range of wavelengths 230 provides a desirable difference between second wavelength 252 of energy 254 and third wavelength 238 of energy 240.

Thickness 258 of second array of graphene sensors 216 affects second wavelength 252. Thickness 258 is selected to only detect second wavelength 252 due to penetration of energy 254. Thickness 258 is in the range of about 10 microns to about 50 microns Stacked graphene arrays 208 may also include third array of graphene sensors 220. In these illustrative examples, third bandpass filter 232 is optional. Energy 240 having third wavelength 238 received by third array of graphene sensors 220 is affected by third bandpass filter 232, when present, and thickness 236 of third array of graphene sensors 220.

When third bandpass filter 232 is present, third bandpass filter 232 absorbs range of wavelengths 244 so that third array of graphene sensors 220 detects third wavelength 238 of energy 240 rather than a range of wavelengths. Third material 262 is selected to absorb range of wavelengths 244.

Thickness 236 of third array of graphene sensors 220 affects third wavelength 238. Thickness 236 is selected to only detect third wavelength 238 due to penetration of energy 240. Thickness 236 is in the range of about 10 microns to about 50 microns.

First wavelength 248, second wavelength 252, and third wavelength 238 are tightly controlled by the design of thermal imaging system 200. More specifically, first wavelength 248, second wavelength 252, and third wavelength 238 are tightly controlled by thickness 250 of first array of graphene sensors 214, first bandpass filter 218, thickness 258 of second array of graphene sensors 216, second bandpass filter 222, thickness 236 of third array of graphene sensors 220, and third bandpass filter 232 when present.

First array of graphene sensors 214, second array of graphene sensors 216, and third array of graphene sensors 220 are stacked. Surface area 264 of first array of graphene sensors 214, surface area 266 of second array of graphene sensors 216, and surface area 268 of third array of graphene sensors 220 are substantially the same. By having stacked graphene arrays 208 rather than adjacent graphene arrays, resolution of thermal imaging system 200 is increased. The resolution of thermal imaging system 200 is of concern in applications involving image magnification. For example, thermal imaging system 200 may be used to image infrared energy of a star in astronomical applications.

During operation, thermal imaging system 200 receives infrared energy 270. First array of graphene sensors 214 creates measurements 272 of energy 246. Second array of graphene sensors 216 creates measurements 274 of energy 254. When present, third array of graphene sensors 220 creates measurements 276 of energy 240.

Temperature 204 is determined using measurements 272 of energy 246 having first wavelength 248 and measurements 274 of energy 254 of second wavelength 252. When third array of graphene sensors 220 is present, temperature 204 is determined using measurements 276 of energy 240 having third wavelength 238 in addition to measurements 272 of energy 246 having first wavelength 248 and measurements 274 of energy 254 of second wavelength 252.

In some illustrative examples, measurements, such as measurements 272, measurements 274, and measurements 276, may be signals created in response to detecting energy, such as energy 246, energy 254, or energy 240. Thermal imaging system 200 is connected to camera 278 configured to process measurements received from thermal imaging system 200.

Camera 278 is connected to thermal imaging system 200. Camera 278 receives measurements 272, measurements 274, and measurements 276 and performs processing on measurements 272, measurements 274, and measurements 276. In some illustrative examples, camera 278 includes at least one of clock drivers, clock and timing generation, gain, analog-to-digital conversion, line driver, oscillator, or bias generation. Camera 278 may generate a two-dimensional image using measurements 272, measurements 274, and measurements 276.

Processor 280 receives the processed measurements. Processor 280 determines temperature 204. One non-limiting example of an equation for determining temperature 204 is equation (1) from Gao et al. *Multicolor optical pyrometer*. WO Patent 1997004292 A1, and reproduced below:

$$R_{\lambda_1} = \varepsilon_{\lambda_1} E_{b\lambda_1}(T_{surf}) + (1-\varepsilon_{\lambda_1}) E_{b\lambda_1}(T_{surr})$$
$$R_{\lambda_2} = \varepsilon_{\lambda_2} E_{b\lambda_2}(T_{surf}) + (1-\varepsilon_{\lambda_2}) E_{b\lambda_2}(T_{surr})$$
$$R_{\lambda_3} = \varepsilon_{\lambda_3} E_{b\lambda_3}(T_{surf}) + (1-\varepsilon_{\lambda_3}) E_{b\lambda_3}(T_{surr}) \quad (1)$$

Where $\varepsilon$ is an emissivity, $\lambda_1$ is first wavelength 248, $\lambda_2$ is second wavelength 252, $\lambda_3$ is third wavelength 238, $E_b$ is an amount of energy emitted by a perfect blackbody from Plank distribution, R is a reflective intensity energy measurement from thermal imaging system 200, $T_{surf}$ is temperature 204 of the surface of structure 205, and $T_{surr}$ is temperature 203 of environment 202. $T_{surr}$ is determined using any desirable method. For example, when solving for $T_{surr}$, $T_{surr}$ may be a value accounting for temperatures of surrounding surfaces and their geometric dispositions.

When stacked graphene arrays 208 includes first array of graphene sensors 214, second array of graphene sensors 216, and third array of graphene sensors 220, first wavelength 248, second wavelength 252, and third wavelength 238 may be tightly controlled by thickness 250 of first array of graphene sensors 214, first bandpass filter 218, thickness 258 of second array of graphene sensors 216, second bandpass filter 222, thickness 236 of third array of graphene sensors 220, and optionally third bandpass filter 232. As a result, it can be assumed that $\varepsilon_{\lambda_1} = \varepsilon_{\lambda_2} = \varepsilon_{\lambda_3} = \varepsilon$. Using this assumption, equation (1) can be solved for $T_{surf}$, $T_{surr}$, and $\varepsilon$.

When stacked graphene arrays includes three arrays of graphene sensors, equation (1) can be solved for $T_{surf}$, $T_{surr}$, and $\varepsilon$. When stacked graphene arrays includes two arrays of graphene sensors, such as first array of graphene sensors 214 and second array of graphene sensors 216, equation (1) can be solved for $T_{surf}$ and $\varepsilon$ if $T_{surr}$ is measured or estimated independently. In some illustrative examples, such as when stacked graphene arrays 208 of thermal imaging system 200 comprises three arrays of graphene sensors, $T_{surr}$ is based on reflective energy received by thermal imaging system 200. In another illustrative example, such as when stacked graphene arrays 208 of thermal imaging system 200 comprises two arrays of graphene sensors, $T_{surr}$ may be determined by another piece of equipment, such as a thermometer or thermocouple. When stacked graphene arrays 208 has only two arrays of graphene sensors, providing $T_{surr}$ from another piece of equipment allows for solution of equation (1) for $T_{surf}$ and $\varepsilon$.

Thermal imaging system 200 is depicted in use within environment 202. For example, thermal imaging system 200 is receiving infrared energy 270 of structure 205 within environment 202. Thermal imaging system 200 is manufactured through a series of deposition and material placement steps in manufacturing environment 282.

The illustration of thermal imaging system 200, environment 202, and manufacturing environment 282 in FIG. 2 is not meant to imply physical or architectural limitations to the manner in which an illustrative embodiment may be implemented. Other components in addition to, or in place of, the ones illustrated may be used. Some components may be unnecessary. Also, the blocks are presented to illustrate some functional components. One or more of these blocks may be combined, divided, or combined and divided into different blocks when implemented in an illustrative embodiment.

For example, in some illustrative examples, third bandpass filter 232 is not present. When third bandpass filter 232 is not present, thickness 236 may control third wavelength 238 of energy 240.

In other illustrative examples, a cooling device may be present to cool thermal imaging system 200. Forming stacked graphene arrays 208 from graphene creates resistive detectors that do not require a cooling device to function at ambient or elevated temperatures. Although not necessary for operation, when a cooling device is present, electronic noise could be reduced.

Although not depicted, stacked graphene arrays 208 are communicatively coupled to camera 278 by a series of wires or other desirable connections. In some illustrative examples, each of stacked graphene arrays 208 is connected to a respective plurality of transmission or communication lines.

In one illustrative example, a plurality of lines is deposited to join each sensor in first array of graphene sensors 214 to camera 278. In this illustrative example, the plurality of lines may be formed of graphene. Each sensor of plurality of second array of graphene sensors 216 and third array of graphene sensors 220 may be communicatively connected outside of second array of graphene sensors 216 and third array of graphene sensors 220 using a plurality of transmission or communication lines.

Figure 3:
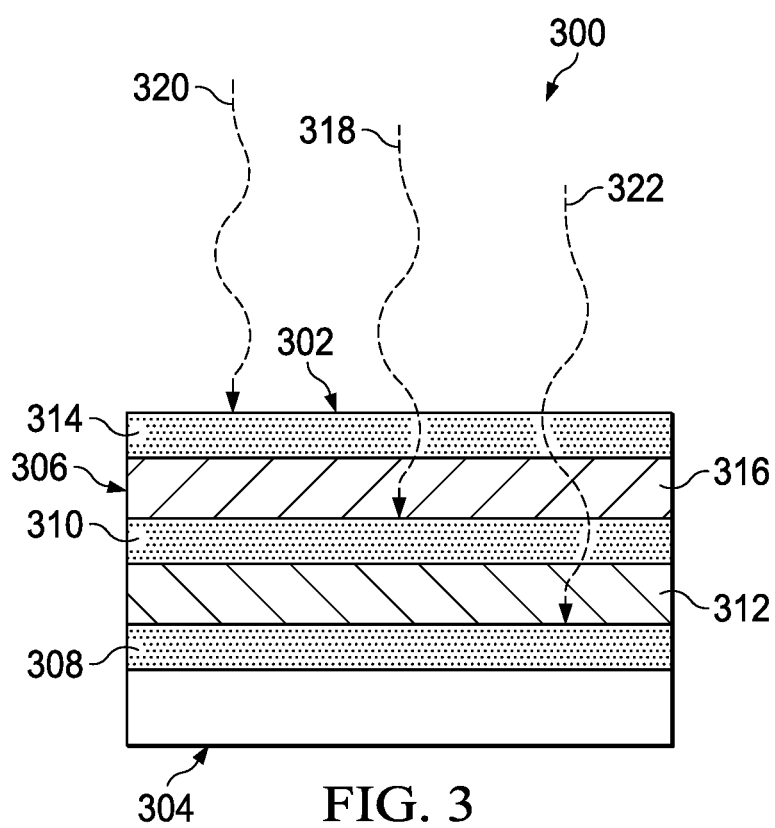
FIG. 3 is an illustration of a cross-sectional view of a thermal imaging system in accordance with an illustrative embodiment.

Turning now to FIG. 3, an illustration of a cross-sectional view of a thermal imaging system is depicted in accordance with an illustrative embodiment. Thermal imaging system 300 is a physical implementation of thermal imaging system 200 of FIG. 2.

Thermal imaging system 300 includes stacked graphene arrays 302 on substrate 304 and number of bandpass filters 306 separating stacked graphene arrays 302. As depicted, stacked graphene arrays 302 comprise first array of graphene sensors 308 on substrate 304 and second array of graphene sensors 310 stacked on top of first array of graphene sensors 308. Number of bandpass filters 306 comprises first bandpass filter 312 between first array of graphene sensors 308 and second array of graphene sensors 310.

Stacked graphene arrays 302 further comprise third array of graphene sensors 314 stacked on top of second array of graphene sensors 310. Number of bandpass filters 306 further comprises second bandpass filter 316 between second array of graphene sensors 310 and third array of graphene sensors 314.

Thermal imaging system 300 is directed towards a structure, such as structure 205. When thermal imaging system 300 is directed towards a structure, stacked graphene arrays 302 face the surface of the structure. When thermal imaging system 300 is directed towards a structure, stacked graphene arrays 302 are between substrate 304 and the structure.

Energy is received by stacked graphene arrays 302 of thermal imaging system 300 from the surface of the structure.

Thermal imaging system 300 is configured such that each successive graphene array of stacked graphene arrays 302 moving from third array of graphene sensors 314 towards first array of graphene sensors 308 detects a longer wavelength of energy.

Second array of graphene sensors 310 detects energy 318 from a surface of a structure, such as structure 205 of FIG. 2. Energy 318 has a second wavelength, such as second wavelength 252 of FIG. 2. Second wavelength of energy 318 is represented by $\lambda_2$ in equation (1) above.

Second array of graphene sensors 310 detects a longer wavelength of energy than third array of graphene sensors 314. Energy 318 detected by second array of graphene sensors 310 has a longer wavelength than energy 320 detected by third array of graphene sensors 314.

Third array of graphene sensors 314 detects energy 320 from a surface of a structure, such as structure 205 of FIG. 2. Energy 320 has a third wavelength, such as third wavelength 238 of FIG. 2. Third wavelength of energy 320 is represented by $\lambda_3$ in equation (1) above.

First array of graphene sensors 308 detects a longer wavelength of energy than second array of graphene sensors 310. Energy 322 detected by first array of graphene sensors 308 has a longer wavelength than energy 318 detected by second array of graphene sensors 310.

First array of graphene sensors 308 detects energy 322 from a surface of a structure, such as structure 205 of FIG. 2. Energy 322 has a first wavelength, such as first wavelength 248 of FIG. 2. First wavelength of energy 322 is represented by $\lambda_1$ in equation (1) above.

Number of bandpass filters 306 is configured to introduce large differences in the wavelengths of the detected energy for stacked graphene arrays 302. Number of bandpass filters 306 is configured to absorb infrared energy.

First bandpass filter 312 absorbs a range of longer wavelengths of energy than second bandpass filter 316. Although not depicted, in some illustrative examples, a third bandpass filter may be present on top of third array of graphene sensors 314. In these illustrative examples, the third bandpass filter would affect the wavelength of energy 320 detected by third array of graphene sensors 314.

Each of stacked graphene arrays 302 on substrate 304 has a thickness of about 10-50 microns. The thickness of each of stacked graphene arrays 302 has a tolerance of ±1 nanometer.

Figure 4:
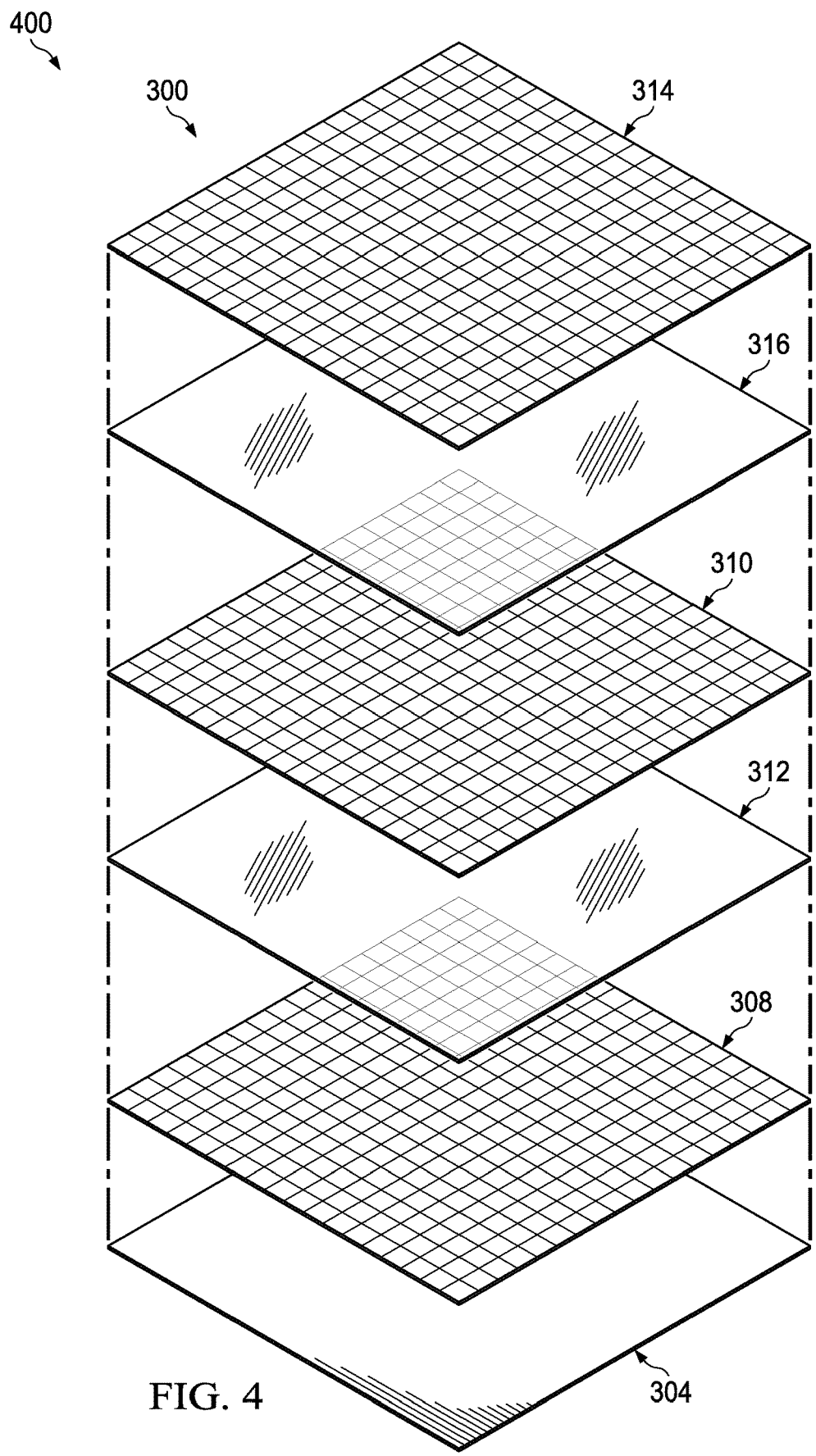
FIG. 4 is an illustration of an exploded view of a thermal imaging system in accordance with an illustrative embodiment.

Turning now to FIG. 4, an illustration of an exploded view of a thermal imaging system is depicted in accordance with an illustrative embodiment. View 400 is an exploded view of thermal imaging system 300 of FIG. 3. As can be seen in view 400, the surface area of each of first array of graphene sensors 308, second array of graphene sensors 310, and third array of graphene sensors 314 have the same surface area.

Figure 5:
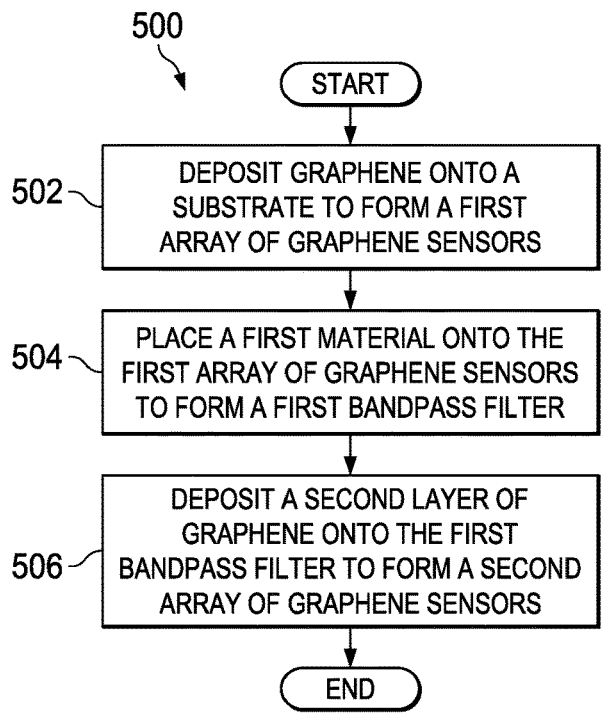
FIG. 5 is an illustration of a flowchart of a method for forming a thermal imaging system in accordance with an illustrative embodiment.

Turning now to FIG. 5, an illustration of a flowchart of a method for forming a thermal imaging system is depicted in accordance with an illustrative embodiment. Method 500 may be used to form thermal imaging system 200 of FIG. 2. Method 500 may be used to form thermal imaging systems to determine a temperature within at least one of engine 108 or engine 110 of FIG. 1. Method 500 may be used to form thermal imaging system 300 of FIGS. 3 and 4.

Method 500 deposits graphene onto a substrate to form a first array of graphene sensors (operation 502). Method 500 places a first material onto the first array of graphene sensors to form a first bandpass filter (operation 504). Method 500 deposits a second layer of graphene onto the first bandpass filter to form a second array of graphene sensors (operation 506). Afterwards, the process terminates. In some illustrative examples, the first array of graphene sensors and the second array of graphene sensors each has a thickness of about 10-50 microns.

Figure 6:
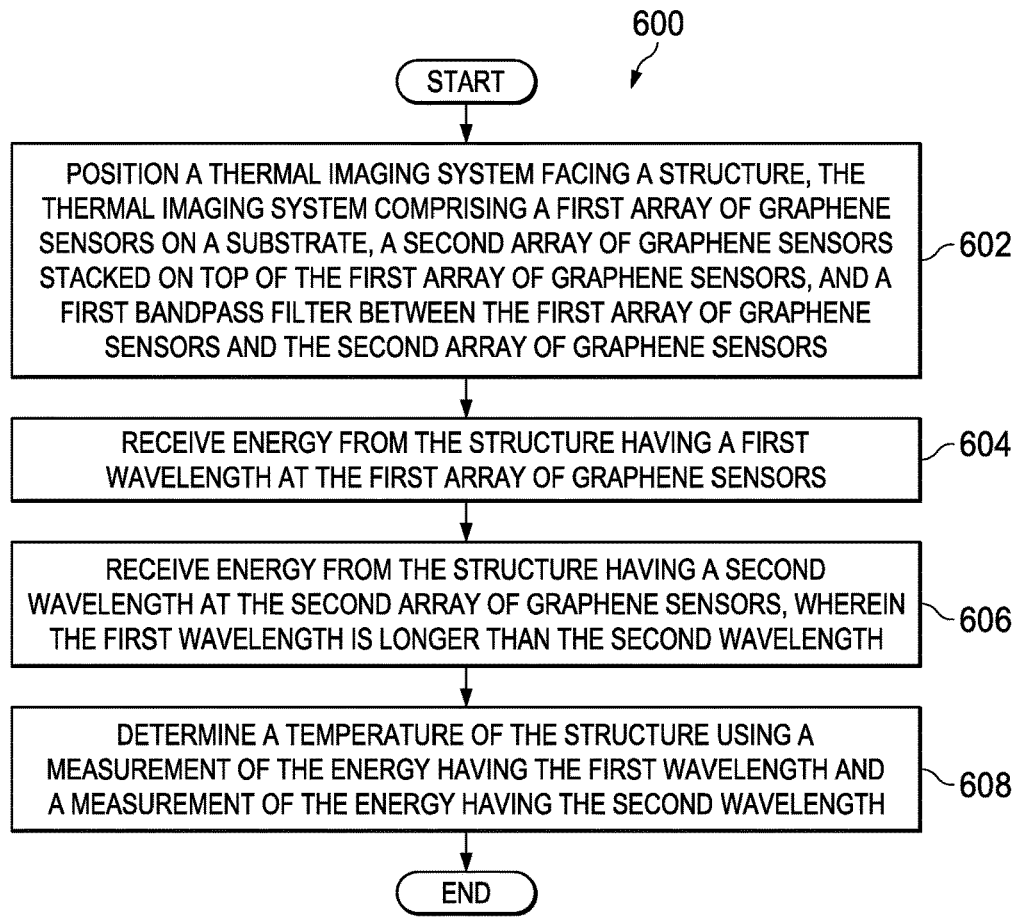
FIG. 6 is an illustration of a flowchart of a method for determining a temperature of a surface of a structure in accordance with an illustrative embodiment.

Turning now to FIG. 6, an illustration of a flowchart of a method for determining a temperature of the surface of a structure is depicted in accordance with an illustrative embodiment. Method 600 may use thermal imaging system 200 of FIG. 2 or thermal imaging system 300 of FIGS. 3 and 4. Method 600 may be used to determine a temperature of at least one of engine 108 or engine 110 of FIG. 1. Method 600 may be used to determine temperature 204 of structure 205 of FIG. 2.

Method 600 positions a thermal imaging system facing a structure, the thermal imaging system comprising a first array of graphene sensors on a substrate, a second array of graphene sensors stacked on top of the first array of graphene sensors, and a first bandpass filter between the first array of graphene sensors and the second array of graphene sensors (operation 602). When the thermal imaging system faces the structure, the first array of graphene sensors and the second array of graphene sensors are between the substrate and the structure.

Method 600 receives energy from the structure having a first wavelength at the first array of graphene sensors (operation 604). Method 600 receives energy from the structure having a second wavelength at the second array of graphene sensors, wherein the first wavelength is longer than the second wavelength (operation 606). Method 600 determines a temperature of the structure using a measurement of the energy having the first wavelength and a measurement of the energy having the second wavelength (operation 608). Afterwards, the process terminates.

The flowcharts and block diagrams in the different depicted illustrative embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the Figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. In some illustrative examples, method 500 of FIG. 5 further comprises placing a second material onto the second array of graphene sensors to form a second bandpass filter, wherein the first bandpass filter absorbs a range of longer wavelengths of energy than the second bandpass filter. In these illustrative examples, method 500 of FIG. 5 further comprises depositing a third layer of graphene onto the second bandpass filter to form a third array of graphene sensors.

In some illustrative examples, method 500 also further comprises placing a third material onto the third array of graphene sensors to form a third bandpass filter, wherein the second bandpass filter absorbs a range of longer wavelengths of energy than the third bandpass filter. In some illustrative examples for method 500, the first bandpass filter and the second bandpass filter are both configured to absorb infrared energy.

In some illustrative examples, method 500 further comprises depositing material onto the substrate to form a plurality of transmission or communication lines for the first array of graphene sensors. The transmission or communication lines connect the first array of graphene sensors to at least one of a camera or other processor. In some illustrative examples, method 500 forms a respective plurality transmission or communication lines for each array of graphene sensors.

A camera may generate a two-dimensional representation using measurements from the thermal imaging system formed using method 500. A processor may determine the temperature of a surface of a structure using measurements from the thermal imaging system formed using method 500.

In some illustrative examples, method 600 of FIG. 6 further comprises filtering energy having a range of wavelengths between the first wavelength and the second wavelength using the first bandpass filter.

In some illustrative examples for method 600, the thermal imaging system further comprises a third array of graphene sensors, and method 600 further comprises receiving energy having a third wavelength at the third array of graphene sensors. The second wavelength is longer than the third wavelength. In these illustrative examples, determining a temperature of the structure uses a measurement of the energy having the third wavelength.

In some illustrative examples, in method 600, the thermal imaging system further comprises a second bandpass filter between the second array of graphene sensors and the third array of graphene sensors. In these illustrative examples, method 600 further comprises filtering energy having a range of wavelengths between the second wavelength and the third wavelength using the second bandpass filter.

In some illustrative examples, a camera may generate a two-dimensional representation using measurements from the thermal imaging system. The measurements may be communicated to A processor may determine the temperature of a surface of a structure using measurements from the thermal imaging system formed using method 500.

The illustrative embodiments describe a fabrication of a carbon nanotube-based IR focal plane array detector in a two or more layer configuration with embedded IR band pass bandpass filter in between. This multi-layered carbon nanotube focal plane array allows for the development of a flexible ambient temperature IR imaging system that can be used for accurate temperature measurement without knowledge of emissivity. The described IR imager can be used for extreme low or high spectra response measurements of Planckian Curves of a black body. A Planck Curve is the spectrum response from a black body at a given temperature.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of forming a thermal imaging system, the method comprising:
    depositing graphene onto a substrate to form a first array of graphene sensors of the thermal imaging system, the first array of graphene sensors having a first thickness configured to receive energy having a first wavelength from a structure due to penetration of energy;
    placing a first material onto the first array of graphene sensors to form a first bandpass filter; and
    depositing a second layer of graphene onto the first bandpass filter to form a second array of graphene sensors of the thermal imaging system, the second array of graphene sensors having a second thickness configured to receive energy having a second wavelength from the structure due to penetration of energy, wherein the first wavelength is longer than the second wavelength.

2. The method of claim 1 further comprising:
    placing a second material onto the second array of graphene sensors to form a second bandpass filter, wherein the first bandpass filter absorbs a range of longer wavelengths of energy than the second bandpass filter; and
    depositing a third layer of graphene onto the second bandpass filter to form a third array of graphene sensors.

3. The method of claim 2 further comprising:
    placing a third material onto the third array of graphene sensors to form a third bandpass filter, wherein the second bandpass filter absorbs a range of longer wavelengths of energy than the third bandpass filter.

4. The method of claim 2, wherein the first bandpass filter and the second bandpass filter are both configured to absorb infrared energy, and wherein the first bandpass filter is configured to absorb a range of wavelengths between the first wavelength and the second wavelength so that the first bandpass filter provides a desirable difference between the first wavelength and the second wavelength.

5. The method of claim 1, wherein each of the first thickness of the first array of graphene sensors and the second thickness of the second array of graphene sensors has a thickness of about 10-50 microns.

6. The method of claim 1 further comprising:
    depositing material onto the substrate to form a plurality of transmission or communication lines for the first array of graphene sensors.

7. A method comprising:
    positioning a thermal imaging system facing a structure, the thermal imaging system comprising a first array of graphene sensors on a substrate, a second array of graphene sensors stacked on top of the first array of graphene sensors, and a first bandpass filter between the first array of graphene sensors and the second array of graphene sensors;
    receiving energy from the structure having a first wavelength at the first array of graphene sensors, wherein the first array of graphene sensors receives the energy based on a first thickness of the first array of graphene sensors and penetration of the energy having the first wavelength;
    receiving energy from the structure having a second wavelength at the second array of graphene sensors, wherein the first wavelength is longer than the second wavelength, and wherein the second array of graphene sensors receives the energy based on a second thickness of the second array of graphene sensors and penetration of the energy having the second wavelength; and determining a temperature of the structure using a measurement of the energy having the first wavelength and a measurement of the energy having the second wavelength.

8. The method of claim 7 further comprising:

filtering energy having a range of wavelengths between the first wavelength and the second wavelength using the first bandpass filter.

9. The method of claim 7, wherein the thermal imaging system further comprises a third array of graphene sensors, the method further comprising:

receiving energy having a third wavelength at the third array of graphene sensors, wherein the second wavelength is longer than the third wavelength; and wherein determining a temperature of the structure uses a measurement of the energy having the third wavelength.

10. The method of claim 9, wherein the thermal imaging system further comprises a second bandpass filter between the second array of graphene sensors and the third array of graphene sensors, the method further comprising:

filtering energy having a range of wavelengths between the second wavelength and the third wavelength using the second bandpass filter.

11. A thermal imaging system comprising:

a substrate;

stacked graphene arrays on the substrate, each graphene array configured to receive energy having a respective wavelength, wherein each graphene array receives the energy based on a respective thickness of the graphene array and penetration of the energy having the respective wavelength; and a number of bandpass filters separating the stacked graphene arrays, wherein each bandpass filter of the number of bandpass filters is sandwiched between two respective graphene arrays of the stacked graphene arrays.

12. The thermal imaging system of claim 11, wherein the stacked graphene arrays comprise a first array of graphene sensors on the substrate and a second array of graphene sensors stacked on top of the first array of graphene sensors; and wherein the number of bandpass filters comprises a first bandpass filter between the first array of graphene sensors and the second array of graphene sensors.

13. The thermal imaging system of claim 12, wherein the stacked graphene arrays further comprise a third array of graphene sensors stacked on top of the second array of graphene sensors; and wherein the number of bandpass filters further comprises a second bandpass filter between the second array of graphene sensors and the third array of graphene sensors.

14. The thermal imaging system of claim 13, wherein the first bandpass filter absorbs a range of longer wavelengths of energy than the second bandpass filter.

15. The thermal imaging system of claim 14, further comprising:

a third bandpass filter on top of the third array of graphene sensors, wherein the second bandpass filter absorbs a range of longer wavelengths of energy than the third bandpass filter.

16. The thermal imaging system of claim 11, wherein each of the stacked graphene arrays on the substrate has a thickness of about 10-50 microns.

17. The thermal imaging system of claim 11, wherein the thermal imaging system is connected to a camera configured to process measurements received from the thermal imaging system.

18. The thermal imaging system of claim 17, wherein each of the stacked graphene arrays is connected to a respective plurality of transmission or communication lines.

19. The method of claim 7 wherein the thermal imaging system is directed towards the structure such that the first array of graphene sensors and the second array of graphene sensors face a surface of the structure.

20. The thermal imaging system of claim 11, wherein the thermal imaging system is directed towards a structure such that the stacked graphene arrays face a surface of the structure.

* * * * *